United States Patent
Choi et al.

(10) Patent No.: US 8,281,206 B2
(45) Date of Patent: Oct. 2, 2012

(54) LOW DENSITY PARITY CODE ENCODING DEVICE AND DECODING DEVICE AND ENCODING AND DECODING METHODS THEREOF

(75) Inventors: Hyun Ho Choi, Suwon-si (KR); Kyung Hun Jang, Suwon-si (KR); Jung Hyun Park, Busan (KR); Yong Ho Cho, Cheonan-si (KR); Dong Jo Park, Daejeon (KR)

(73) Assignees: Samsung Electronics Co., Ltd., Suwon-Si (KR); Korea Advanced Institute of Science and Technology, Daejeon (KR)

( * ) Notice: Subject to any disclaimer, the term of this patent is extended or adjusted under 35 U.S.C. 154(b) by 995 days.

(21) Appl. No.: 12/268,534

(22) Filed: Nov. 11, 2008

(65) Prior Publication Data

US 2009/0313524 A1 Dec. 17, 2009

(30) Foreign Application Priority Data

Jun. 17, 2008 (KR) ........................ 10-2008-0057099

(51) Int. Cl.
*H03M 13/00* (2006.01)
(52) U.S. Cl. ...................................................... 714/752
(58) Field of Classification Search .................. 714/752, 714/758–762, 780–786, 790–793, 796, 801, 714/803, 821
See application file for complete search history.

(56) References Cited

U.S. PATENT DOCUMENTS

| | | | |
|---|---|---|---|
| 6,795,424 B1 * | 9/2004 | Kapoor et al. | 370/343 |
| 7,457,588 B2 * | 11/2008 | Love et al. | 455/67.11 |
| 2002/0105928 A1 * | 8/2002 | Kapoor et al. | 370/334 |
| 2005/0201315 A1 * | 9/2005 | Lakkis | 370/315 |
| 2006/0013181 A1 | 1/2006 | Stolpman et al. | |
| 2007/0026810 A1 * | 2/2007 | Love et al. | 455/67.11 |
| 2007/0058676 A1 * | 3/2007 | Lim et al. | 370/468 |
| 2010/0077276 A1 * | 3/2010 | Okamura et al. | 714/752 |

FOREIGN PATENT DOCUMENTS

| | | |
|---|---|---|
| EP | 1883161 | 1/2008 |
| WO | WO 93/01673 | 1/1993 |
| WO | WO 02/093779 | 11/2002 |
| WO | WO 2006/000952 | 1/2006 |

\* cited by examiner

*Primary Examiner* — Nadeem Iqbal
(74) *Attorney, Agent, or Firm* — NSIP Law

(57) ABSTRACT

A low density parity code (LDPC) encoding and decoding devices and encoding and decoding methods thereof are provided. An LDPC encoding device includes an information obtaining unit which obtains status information of at least two frequency bands, a matrix generation unit which generates a parity check matrix based on the status information, the parity check matrix including sub matrices which correspond to the at least two frequency bands, and an encoder which generates data bits and parity bits using an LDPC with the generated parity check matrix.

30 Claims, 7 Drawing Sheets

FIG. 5

| $SNR(f_1)-SNR(f_2)$ | VARIABLE NODE DEGREE OF $f_1$ | VARIABLE NODE DEGREE OF $f_2$ |
|---|---|---|
| 5 dB | 4 | 2 |
| 10 dB | 5 | 2 |
| 15 dB | 10 | 2 |
| 20 dB | 16 | 2 |
| 25 dB | 25 | 2 |
| 30 dB | 29 | 2 |

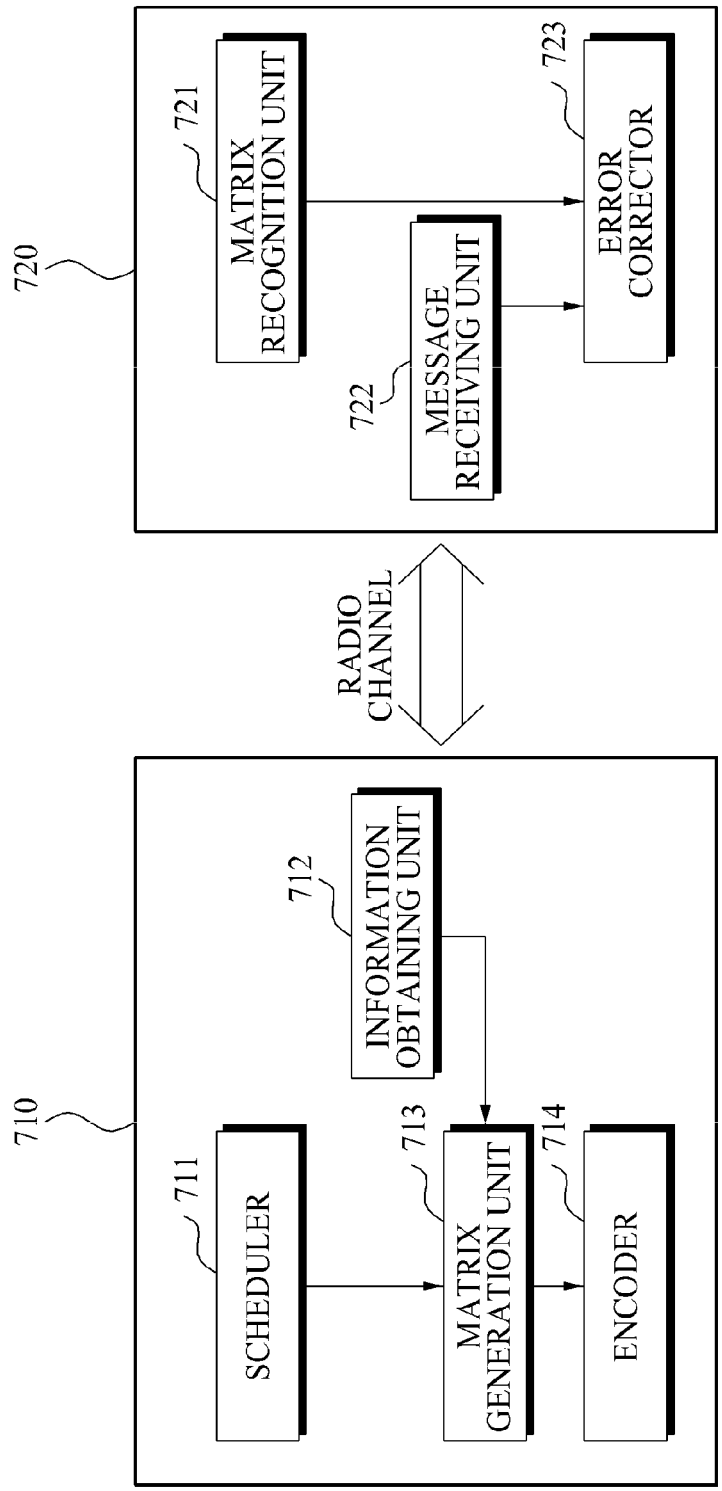

LOW DENSITY PARITY CODE ENCODING DEVICE AND DECODING DEVICE AND ENCODING AND DECODING METHODS THEREOF

CROSS-REFERENCE TO RELATED APPLICATION

This application claims the benefit under 35 U.S.C. §119 (a) of a Korean Patent Application No. 10-2008-0057099, filed on Jun. 17, 2008 in the Korean Intellectual Property Office, the disclosure of which is incorporated herein by reference in its entirety.

TECHNICAL FIELD

The following description relates to an encoding and decoding technology, and more particularly, to a low density parity code encoding and decoding technology in a communication system using a plurality of frequency bands.

BACKGROUND

There are active researches being conducted to transmit various multimedia services at high speed and high quality in a wireless communication environment. Of the related technologies, channel coding is one area of technology gathering attention.

For example, attentions have been paid to an encoding scheme according to a low density parity code (LDPC) which may achieve the lowest bit error rate (BER) compared to other encoding techniques. Also, new techniques are being developed with less complexity, and capability to perform both LDPC encoding and decoding.

To enhance system capacity, communication systems may utilize multiple frequency bands. As an example, a cognitive communication system may recognize the entire or a portion of frequency bands assigned to a primary system, and perform communications with the recognized frequency bands. Here, frequency bands used by the cognitive communication system may be non-adjacent and a number of the frequency bands may be at least two.

A wireless channel may be formed between a transmitting end and a receiving end, which belong to the communication system, and a status of the wireless channel may depend on the frequency bands. As an example, while a status of a wireless channel may be good in a first frequency band, the status of the wireless channel in a second frequency band may be poor. Such wireless channels may be referred to as frequency selective channels.

As an illustration, it is assumed that a communication system utilizes two frequency bands. In this assumption, in a case where statuses of wireless channels are considered to be identical in the two frequency bands, for example, where the two frequency bands are adjacent to each other, the communication system may be capable of transmitting/receiving encoded messages using the two frequency bands, wherein the encoded messages being encoded according to an identical scheme. However, where statuses of wireless channels may not be considered identical in the two frequency bands, for example, where the two frequency bands are not adjacent to each other, it may be ineffective for the communication system to transmit/receive encoded messages using the two frequency bands, wherein the encoded messages being encoded according to an identical scheme.

In particular, since a cognitive radio communication system may change frequency bands to use in real-time, it may be ineffective for the cognitive radio system to generate encoded messages while considering frequency selective properties of wireless channels.

Accordingly, there is a need for a technique to effectively perform low density parity code encoding and decoding while considering frequency selective properties of wireless channels.

SUMMARY

In one general aspect, a low density parity code encoding device comprises an information obtaining unit which obtains status information of at least two frequency bands, a matrix generation unit which generates a parity check matrix based on the status information, the parity check matrix including sub matrices which correspond to the at least two frequency bands, and an encoder which generates data bits and parity bits using a low density parity code (LDPC) with the generated parity check matrix.

The status information of the at least two frequency bands may comprise information related to a signal to noise ratio (SNR) and/or a signal to interference plus noise ratio (SINR) of the at least two frequency bands.

The matrix generation unit may generate the parity check matrix by adaptively adjusting variable node degrees of the sub matrices based on the status information.

The matrix generation unit may determine a difference between statuses of the at least two frequency bands based on the status information of the at least two frequency bands, and generate the parity check matrix by adjusting variable node degrees of the sub matrices according to the determined difference between the statuses.

Where the at least two frequency bands comprise a first frequency band and a second frequency band and where a status of the first frequency band is superior to a status of the second frequency band, the matrix generation unit may generate the parity check matrix so that a variable node degree of a first sub matrix corresponding to the first frequency band is greater than a variable node degree of a second sub matrix corresponding to the second frequency band.

Where the at least two frequency bands comprise a first frequency band and a second frequency band and where a status of the second frequency band is superior to a status of the first frequency band, the matrix generation unit may generate the parity check matrix so that a variable node degree of a first sub matrix corresponding to the first frequency band is less than a variable node degree of a second sub matrix corresponding to the second frequency band.

Where the at least two frequency bands comprise a first frequency band and a second frequency band and where a status of the first frequency band is superior to a status of the second frequency band, the encoder may generate the data bits and parity bits so that more data bits are arranged in the first frequency band than the second frequency band and more parity bits are arrange in the second frequency band than the first frequency band.

The device may further comprise a scheduler which recognizes the at least two frequency bands using a cognitive radio technology and schedules the recognized at least two frequency bands.

The at least two frequency bands may not be adjacent to each other.

The low density parity code encoding device may be used in a communication system having a primary system, and the primary system may have a priority over at least one frequency band of the at least two frequency bands.

The at least two frequency bands may be independent to each other and the scheduler may bind the at least two frequency bands and schedule the bound at least two frequency bands.

In another general aspect, a low density parity code encoding device comprises a message receiving unit which receives a message including data bits and parity bits using at least two frequency bands, the message being generated by encoding using a low density parity code (LDPC) with a parity check matrix, a matrix recognition unit which recognizes the parity check matrix, and an error corrector which corrects an error in the received message using the recognized parity check matrix.

The parity check matrix may comprise sub matrixes which correspond to the at least two frequency bands, and variable node degrees of the sub matrices may be determined depending on statuses of the at least two frequency bands.

The variable node degrees of the sub matrices may be adjusted according to a difference between the statuses of the at least two frequency bands.

The device may further comprise a resource management unit recognizing the at least two frequency bands using a cognitive radio technology.

The error corrector may correct the error according to an iteration decoding scheme.

Where the at least two frequency bands comprise a first frequency band and a second frequency band, where the parity check matrix comprises a first sub matrix corresponding to the first frequency band and a second sub matrix corresponding to the second frequency band, and where a status of the first frequency band is superior to a status of the second frequency band, a variable node degree of the first sub matrix may be determined to be greater than a variable node degree of the second sub matrix.

In still another general aspect, a low parity code encoding method comprises recognizing at least two frequency bands using a cognitive radio technology and scheduling the recognized at least two frequency bands, obtaining status information of the at least two frequency bands, generating a parity check matrix based on the status information, the parity check matrix comprising sub matrices corresponding to the at least two frequency bands, and generating data bits and parity bits using a low density parity code (LDPC) with the generated parity check matrix.

The generating of the parity check matrix may comprise generating the parity check matrix by adaptively adjusting variable node degrees of the sub matrices based on the status information.

Where the at least two frequency bands comprise a first frequency band and a second frequency band and where a status of the first frequency band is superior to a status of the second frequency band, the generating of the parity check matrix may comprise generating the parity check matrix so that a variable node degree of a first sub matrix corresponding to the first frequency band is greater than a variable node degree of a second sub matrix corresponding to the second frequency band.

In yet another aspect, a low density parity code decoding method comprises receiving a message including data bits and parity bits using at least two frequency bands, the message being generated by encoding using a low density parity code (LDPC) with a parity check matrix, recognizing the parity check matrix, and correcting an error in the received message according to an iteration decoding scheme with the recognized parity check matrix.

The parity check matrix may comprise sub matrixes which correspond to the at least two frequency bands, and variable node degrees of the sub matrices may be determined depending on statuses of the at least two frequency bands.

The variable node degrees of the sub matrixes may adjusted according to a difference between the statuses of the at least two frequency bands.

In yet another aspect, a terminal for use in a wireless communication system comprises a transmitting unit to transmit a portion of encoded data using a first frequency band and another portion of the encoded data using a second frequency band, and an encoding device to generate the encoded data comprising data bits and parity bits using a block code with a parity check matrix being generated based on status information of the first and second frequency bands. The block code may be a low density parity code (LDPC).

The status information may comprise information related to a signal to noise ratio (SNR) and/or a signal to interference plus noise ratio (SINR) of the first and second frequency bands.

The parity check matrix may comprise sub matrices corresponding to the first and second frequency bands, and may be generated by adjusting variable node degrees of the sub matrices based on the status information.

Where a status of the first frequency band is superior to a status of the second frequency band and where the parity check matrix comprises a first sub matrix corresponding to the first frequency band a second sub matrix corresponding to the second frequency band, the parity check matrix may be generated so that a variable node degree of the first sub matrix is greater than a variable node degree of the second sub matrix.

Where a status of the first frequency band is superior to a status of the second frequency band, the encoding device may generate the data bits and parity bits so that more data bits are arranged in the first frequency band than the second frequency band and more parity bits are arrange in the second frequency band than the first frequency band.

In yet another aspect, a terminal for use in a wireless communication system comprises a receiving unit to receive a portion of encoded data using a first frequency band and another portion of the encoded data using a second frequency band, the encoded data being generated by using a block code with a parity check matrix, and an decoding device to correct an error in the encoded data using the parity check matrix, wherein the encoded data comprises data bits and parity bits and is generated based on status information of the first and second frequency bands.

The parity check matrix may comprise sub matrixes which correspond to the first and second frequency bands and variable node degrees of the sub matrices may be determined based on statuses of the first and second frequency bands. Other features will become apparent to those skilled in the art from the following detailed description, which, taken in conjunction with the attached drawings, discloses exemplary embodiments of the invention.

BRIEF DESCRIPTION OF THE DRAWINGS

FIG. 5 is a table illustrating variable node degrees adjusted by a difference of a status between a first frequency band (center frequency $f_1$) and a second frequency band (center frequency $f_2$) according to an exemplary embodiment.

FIG. 7 is a block diagram illustrating a low density parity code encoding device and a low density parity code decoding device according to an exemplary embodiment.

Throughout the drawings and the detailed description, unless otherwise described, the same drawing reference numerals will be understood to refer to the same elements, features, and structures. The elements may be exaggerated for clarity and convenience.

DETAILED DESCRIPTION

The following detailed description is provided to assist the reader in gaining a comprehensive understanding of the media, apparatuses, methods and/or systems described herein. Accordingly, various changes, modifications, and equivalents of the systems, methods, apparatuses and/or media described herein will be suggested to those of ordinary skill in the art. Also, description of well-known functions and constructions are omitted to increase clarity and conciseness.

Figure 1:
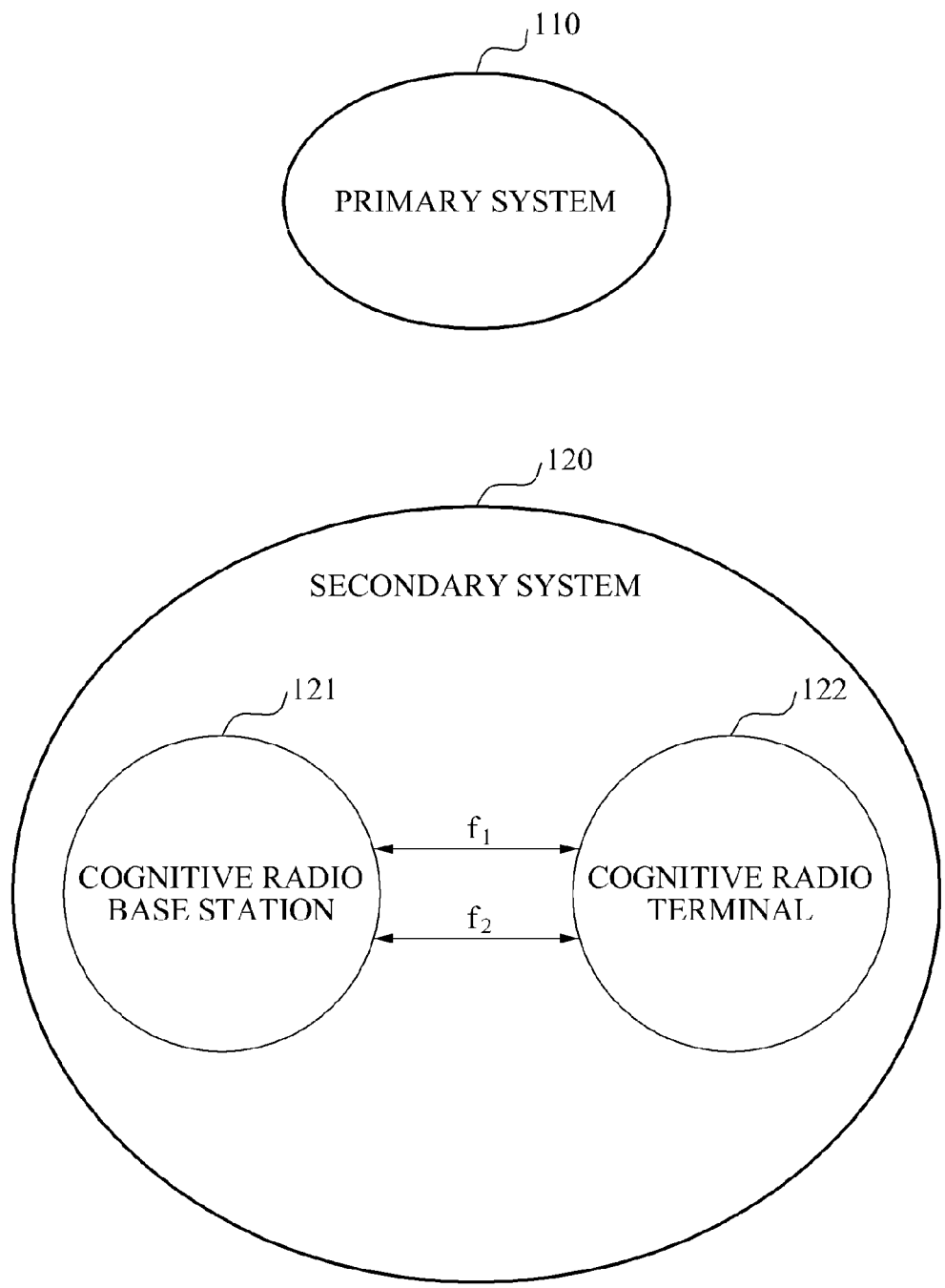
FIG. 1 is a diagram illustrating a secondary system which uses a primary system and a cognitive radio technique according to an exemplary embodiment.

FIG. 1 illustrates a secondary system 120 which uses a primary system 110 and a cognitive radio technique according to an exemplary embodiment.

Referring to FIG. 1, the secondary system 120 comprises a cognitive radio base station 121 and a cognitive radio terminal 122.

The cognitive radio base station 121 and the cognitive radio terminal 122 may be capable of recognizing the entire or a portion of frequency bands allocated to the primary system 110 to be available frequency bands ($f_1$, $f_2$) using a cognitive radio technology. Also, the cognitive radio base station 121 and the cognitive radio terminal 122 may communicate with each other using the recognized available frequency resources.

However, the primary system 110 may have priority over the secondary system 120 for the available frequency bands ($f_1$, $f_2$). The secondary system 120, under a condition that the secondary system 120 does not interfere with communication of the primary system 110, may utilize the available frequency bands ($f_1$, $f_2$). Accordingly, where signals of the primary system 110 is sensed, the secondary system 120 may be required to change the available frequency bands ($f_1$, $f_2$) to other frequency bands.

For example, it is assumed that the secondary system 120 is using the frequency bands ($f_1$, $f_2$). In this case, the frequency bands in use ($f_1$, $f_2$) may be non-adjacent from each other, and in the frequency bands in use ($f_1$, $f_2$), statuses of wireless channels formed between the cognitive radio base station 121 and the cognitive radio terminal 122 may differ. This is because statuses of wireless channels of non-adjacent frequency bands are generally not considered to be identical.

Where a status of a wireless channel of a frequency band ($f_1$) is good, and a wireless channel status of a frequency band ($f_2$) is poor, messages transmitted using the frequency band ($f_2$) may contain more errors than messages transmitted using the frequency band ($f_1$).

According to an exemplary embodiment, during the course of correcting errors in messages transmitted via frequency band ($f_1$) in use and of correcting errors in messages transmitted via frequency band ($f_2$) in use, it is possible to increase influence of the messages transmitted via frequency band ($f_1$) and to reduce influence of the messages transmitted via frequency band ($f_2$). Where the status of the frequency band ($f_1$) is good, statistically, the messages transmitted via frequency band ($f_1$) should contain fewer errors. According to an aspect, by placing more weight value for the messages transmitted via frequency band ($f_1$), it is possible to increase influence of the messages transmitted via frequency band ($f_1$) over the messages transmitted via frequency band ($f_2$). Accordingly, it may be possible to perform more accurate error correction for the messages transmitted via frequency band ($f_1$) and messages transmitted via frequency band ($f_2$).

Figure 2:
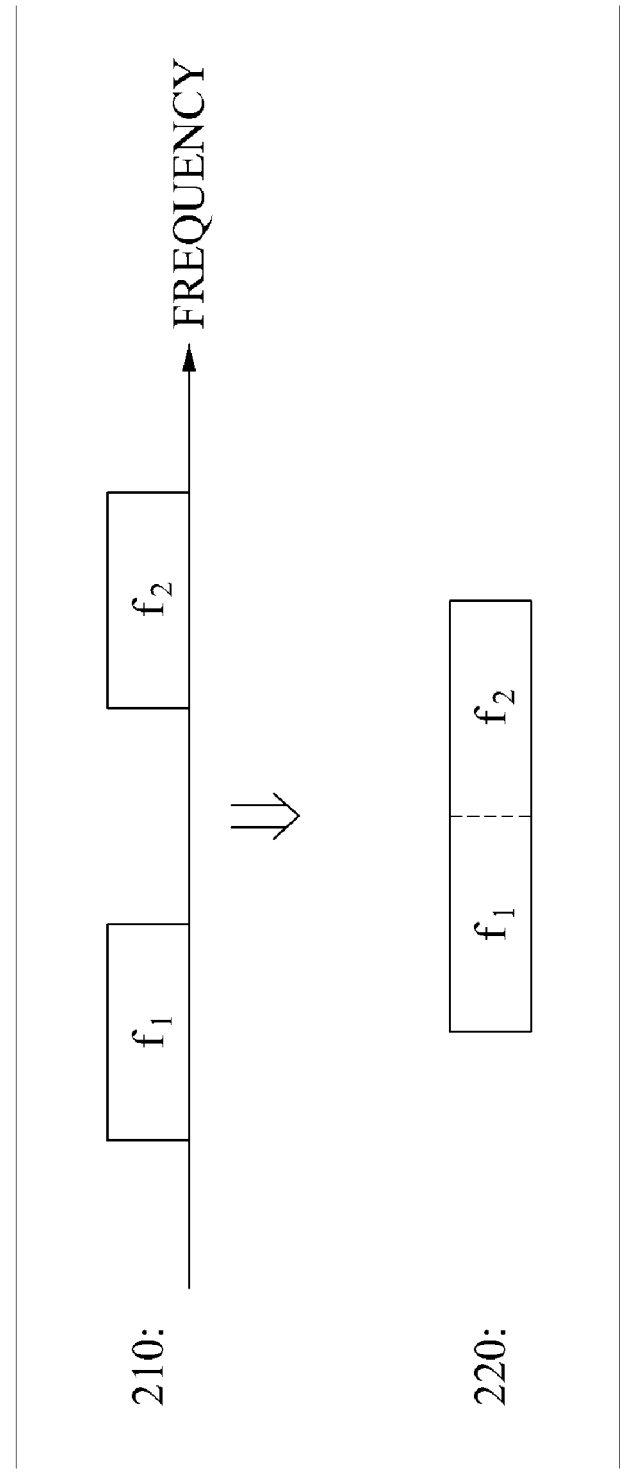
FIG. 2 is a conceptual diagram illustrating bonding of frequency bands according to an exemplary embodiment.

FIG. 2 conceptually illustrates bonding of frequency bands according to an exemplary embodiment.

Communication systems may be capable of using at least two frequency bands which are not adjacent to each other. For example, in a cognitive radio communication system, since the cognitive radio system changes frequency bands to use depending on existence of a primary system, at least two frequency bands which are not adjacent to each other may be typically used by the cognitive radio system.

Where at least two frequency bands which are not adjacent to each other are used, a communication system may combine the at least two non-adjacent frequency bands.

Referring to FIG. 2, a section of bandwidth 210 represents two frequency bands being used by a communication system. One frequency band has a center frequency in $f_1$ and the other frequency band has a center frequency in $f_2$.

A combination 220 represents bonding of the two frequency bands performed by the communication system. The communication system, by combining the two non-adjacent frequency bands, may treat the two frequency bands as a single frequency band.

Figure 3:
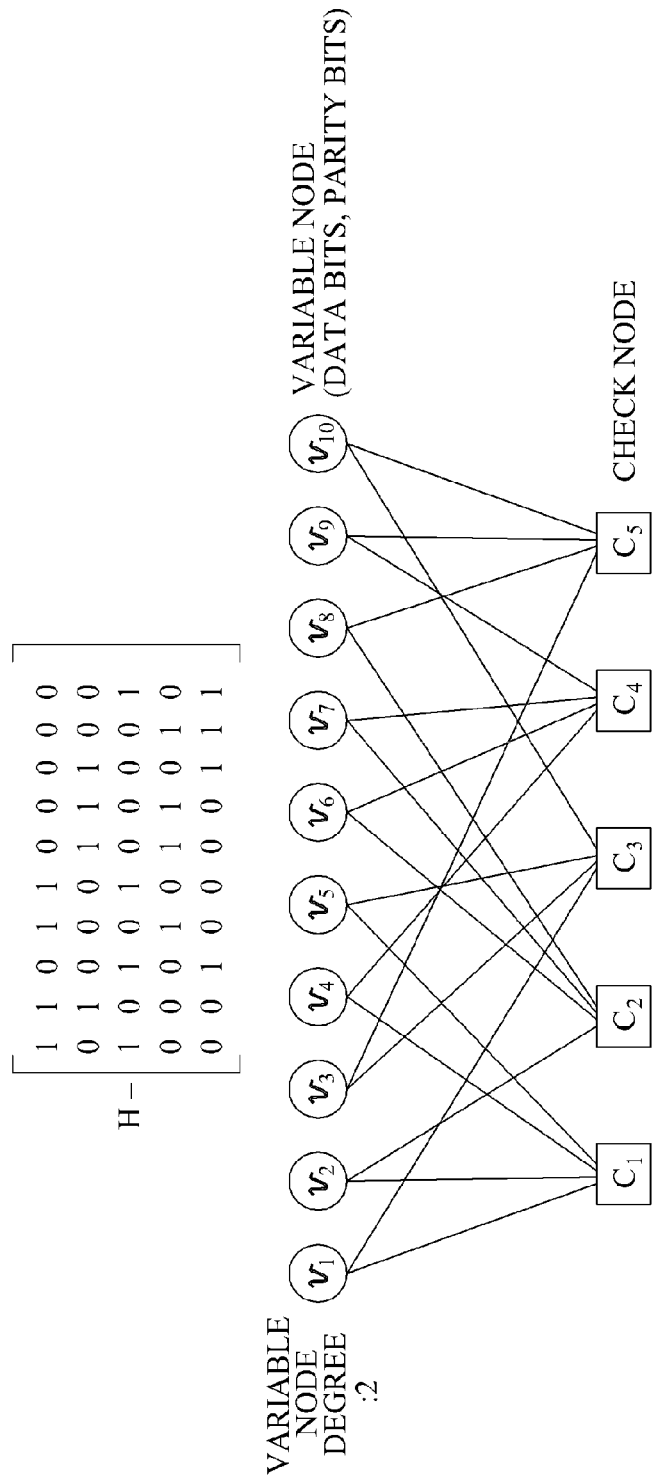
FIG. 3 is a diagram illustrating an exemplary parity check matrix and a factor graph which corresponds to the parity check matrix.

FIG. 3 illustrates an exemplary parity check matrix and a factor graph which corresponds to the parity check matrix.

Before describing FIG. 3, a description on a low density parity code (LDPC) will be provided below. An LDPC, which is one type of a block code, may be defined according to a parity check matrix. To decrease the complexity for decoding, the LDPC code may utilize a parity check matrix including the least number of '1's. In the LDPC code, decoding may be performed using soft decision decoding algorithms such as a sum-product algorithm, a minimum-sum algorithm, and the like.

As an illustration, it is assumed that (source) data is k bits and data encoded according to the LDPC code is n bits. Here, the encoded data of n bits includes the data of k bits and parity of (n−k) bits. In this case, where the data of k bits and parity of (n−k) bits correspond to variable nodes and where check bits correspond to check nodes, a parity check matrix may be defined based on link relationships between the variable nodes and the check nodes.

An LDPC encoder may generate encoded data under the constraint of Equation 1.

$$Hx=0$$

$$x=Gu^T \quad \text{[Equation 1]}$$

where H is a parity check matrix of m×n dimensions, m is a number of check nodes, X is encoded data of n bits (code word), u is (source) data of k bits, and G is a generating matrix of n×k dimensions.

The number of '1's included in each column of the parity check matrix may be referred to as a variable node degree. Also, the number of '1's included in each row of the parity check matrix may be referred to as a check node degree. Where variable node degrees for all columns are identical to each other, and check node degrees for all rows are identical to each other, the LDPC is a regular LDPC. Where a variable node degree is different in the columns or a check node degree is different in the rows, the LDPC is an irregular LDPC.

Referring to FIG. 3, a parity check matrix (H) is defined based on the link relationships between variable nodes ($v_1$, $v_2$, ... $v_{10}$) and check nodes ($c_1$, $c_2$, $c_3$, ... $c_5$). Variable nodes ($v_1$, $v_2$, ..., $v_{10}$) correspond to encoded data, and the encoded data include data bits and parity bits. The check nodes correspond to check bits. The dimensions of the parity check matrix (H) is 5×10 based on the number of variable nodes and the number of check nodes.

In the factor graph illustrating the link relationship between the variable nodes and check nodes, since $v_1$ is linked with $c_1$ and $c_3$, elements in a first row and a first column and in the first column and a third row of the parity check matrix (H) are '1' and all the other elements in the first column is '0'. Likewise, since $v_2$ is linked with $c_1$ and $c_2$, elements in a second column and the first row and in the second column and a second row are '1' and the rest of the second column elements are '0'. According to the above described exemplary method, all elements of the parity check matrix are determined to be either '1' or '0'.

Also, the variable node degrees are identical to the number of linked lines to the variable nodes, and the check node degrees are identical to the number of linked lines to the check nodes. Referring to the factor graph in FIG. 3, since each of the variable nodes is linked with two lines, the variable node degree is '2', and the check node degree is '4'.

When a decoding is performed, each variable node and check node either transmits its own decoding result to linked nodes or receives decoding results from the linked nodes. Where a node receives a decoding result from another node, the node performs decoding using a decoding result of the other node, and transmits the decoding result to another linked node. By repeating the above, the decoding process may be completed.

As illustrated in FIG. 3, where a number of linked lines to each of the variable nodes are identical, each of the variable nodes may exert almost identical influence on the overall decoding process.

However, encoded data corresponding to each of the variable nodes may be transmitted via various frequency bands. As an example, where there are two frequency bands, a portion of the encoded data (first encoded data) may be transmitted via a frequency band with a wireless channel in a good status, and the rest of the encoded data (second encoded data) may be transmitted via a frequency band with a wireless channel in a poor status.

In such case, it may be ineffective for variable nodes to exert almost identical influence in the decoding process.

According to an exemplary embodiment, a parity check matrix may be generated so that first variable nodes corresponding to the first encoded data exerts more influence on the decoding process, and second variable nodes corresponding to the second encoded data exerts less influence on the decoding process. In other words, by determining the variable node degree of the first variable nodes and the variable node degree of the second variable nodes according to the wireless channel statuses of the frequency bands, it may be possible to perform more effective error correction in the encoded data.

Figure 4:
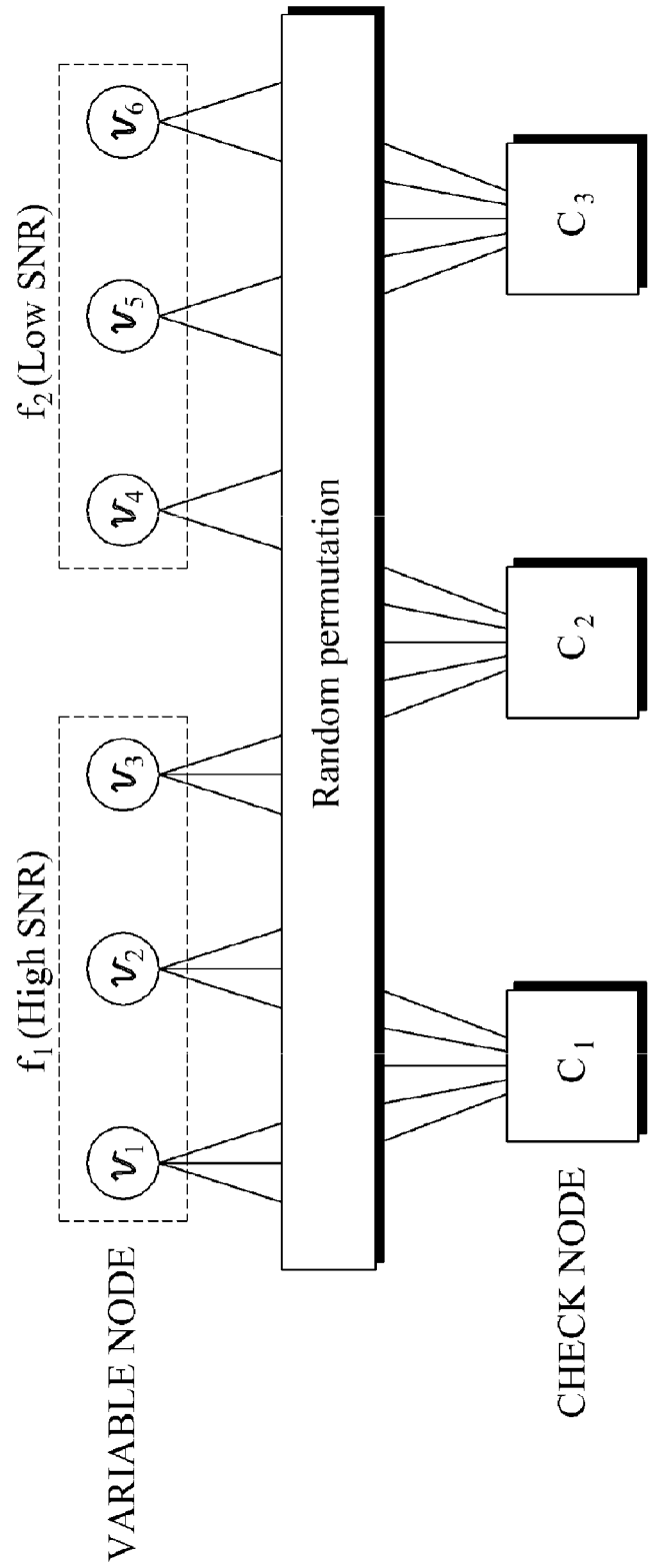
FIG. 4 is a diagram illustrating a factor graph in a case where variable node degrees which correspond to frequency bands differ from each other according to an exemplary embodiment.

FIG. 4 illustrates a factor graph in a case where variable node degrees which correspond to frequency bands differ from each other according to an exemplary embodiment.

As an illustration only, the following description refers to a case of communication using two frequency bands as illustrated in FIG. 4. Accordingly, it is understood that the teachings herein are not limited to this condition, and may be applied to a case of communication using more than two frequency bands.

Referring to FIG. 4, variable nodes ($v_1$, $v_2$, $v_3$ $v_4$, $v_5$, $v_6$) undergo a random permutation and are linked to check nodes ($C_1$, $C_2$, $C_3$). Also, each of the variable nodes ($v_1$, $v_2$, $v_3$ $v_4$, $v_5$, $v_6$) and the check nodes ($C_1$, $C_2$, $C_3$) are capable of transmitting its own decoding results to other linked nodes, and performs the decoding with references to the decoding results of the other linked nodes.

A communication system uses a first frequency band (center frequency $f_1$) and a second frequency band (center frequency $f_2$). The signal to noise ratio (SNR) is high in the first frequency band and low in the second frequency band. Generally, it is understood that a status of a wireless channel is superior as an SNR of a wireless channel is higher. However, the determination of a wireless channel status may not sorely depend on SNR, but may also depend on a signal to interference plus noise ratio (SINR).

A low density party code encoder according to an exemplary embodiment may adaptively adjust the variable node degrees of the various nodes ($v_1$, $v_2$, $v_3$) corresponding to the first frequency band, and the variable node degrees of the various nodes ($v_4$, $v_5$, $v_6$) corresponding to the second frequency band according to the wires channel status. Adaptively adjusting the variable node degrees of the various nodes ($v_1$, $v_2$, $v_3$) corresponding to the first frequency band and the variable node degrees of the various nodes ($v_4$, $v_5$, $v_6$) corresponding to the second frequency band may have an identical effect of adaptively generating a parity check matrix.

For example, where the variable node degree corresponding to the first frequency band is '3' and the variable node degree corresponding to the second frequency band is '2', the variable nodes corresponding to the first frequency band ($v_1$, $v_2$, $v_3$) exert more influence than the variable nodes corresponding to the second frequency band ($v_4$, $v_5$, $v_6$). Errors of the variable nodes ($v_1$, $v_2$, $v_3$) corresponding to the first frequency band statistically occur less than errors of variable nodes ($v_4$, $v_5$, $v_6$) corresponding to the second frequency band, and thus the overall decoding performance may be improved.

In another perspective, where a parity check matrix includes a sub matrix corresponding to the first frequency band and another sub matrix corresponding to the second frequency band, it may be understood that both a variable node degree of the sub matrix corresponding to the first frequency band and a variable node degree of the sub matrix corresponding to the second frequency band are adaptively adjusted.

FIG. 5 shows a table illustrating variable node degrees adjusted by the difference of a status between a first frequency band (center frequency $f_1$) and a second frequency band (center frequency $f_2$) according to an exemplary embodiment.

Referring to FIG. 5, a low parity code encoding device and a low parity code decoding device according to an exemplary embodiment store a variable node degree for the first frequency band and a variable node degree for the second frequency band into a memory in advance along with a difference of a signal to noise ratio (SNR($f_1$)) of the first frequency band and a signal to noise ratio (SNR($f_2$)) of the second frequency band. Here, the signal to noise ratio (SNR($f_1$)) of the first frequency band is higher than the signal to noise ratio (SNR($f_2$)) of the second frequency band.

Where differences of the signal to noise ratio ($SNR(f_1)$) of the first frequency band and the signal to noise ratio ($SNR(f_2)$) of the second frequency band are 5 dB, 10 dB, 15 dB, 20 dB, 25 dB, and 30 dB, the variable node degree for the first frequency band and the second frequency band are predetermined to be (4, 2), (5, 2), (10, 2), (16, 2), (25, 2) and (29, 2) respectively.

The low density parity code encoding device according to an exemplary embodiment may obtain information regarding the signal to noise ratio ($SNR(f_1)$) for the first frequency band and the signal to noise ratio ($SNR(f_2)$) for the second frequency band, and may determine the variable node degrees for the first frequency band and the second frequency band based on the information. Also, a parity check matrix may be generated depending on the determined variable node degrees for the first frequency range and the second frequency range, and the low density parity code encoding device according to an exemplary embodiment may generate encoded data according to the parity check matrix.

Also, the low density parity code decoding device according to an exemplary embodiment may decode the received encoded data by analyzing the parity check matrix.

Figure 6:
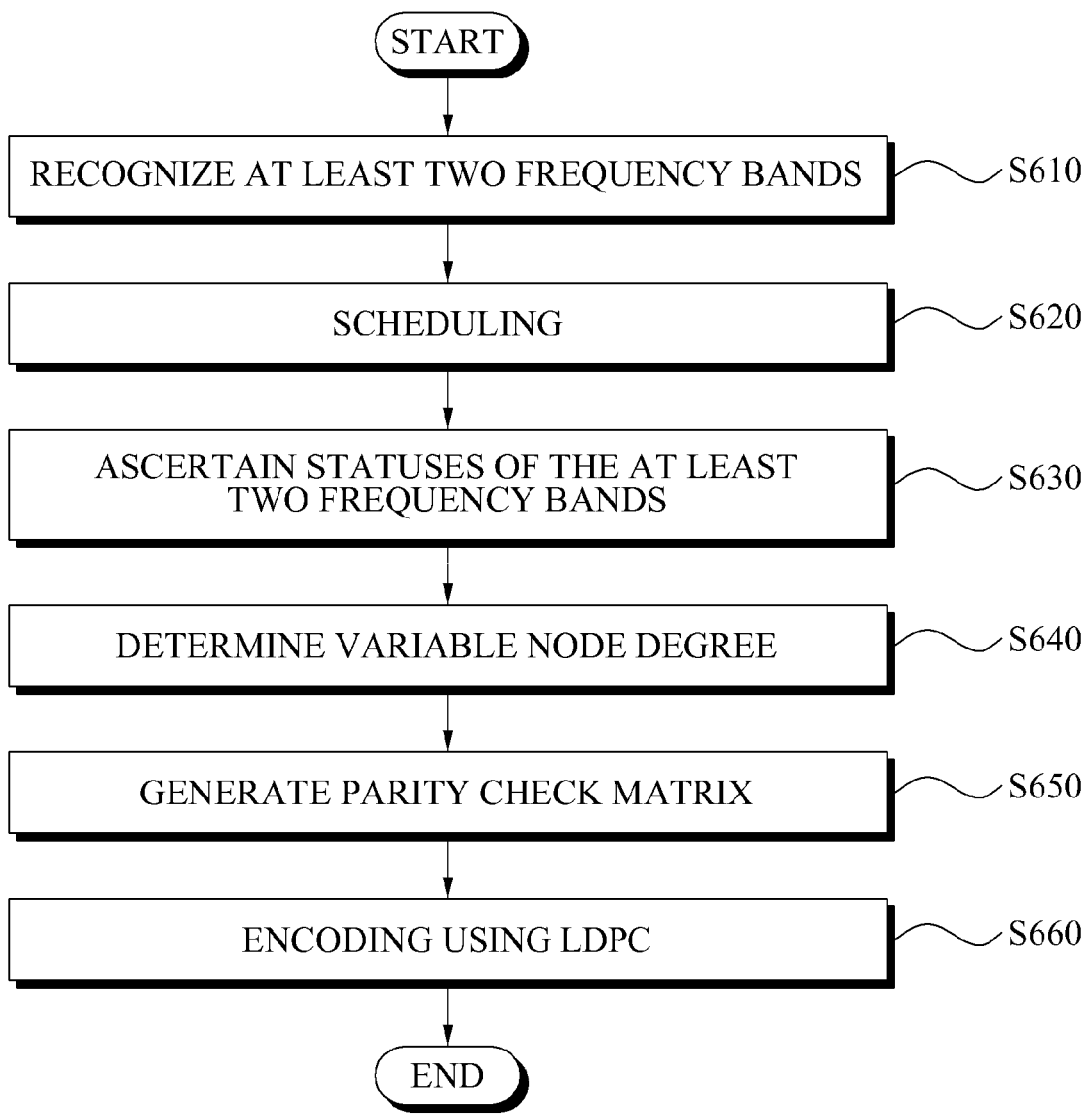
FIG. 6 is a flowchart illustrating a low density parity code encoding method according to an exemplary embodiment.

FIG. 6 shows a flowchart illustrating a low density parity code encoding method according to an exemplary embodiment.

Referring to FIG. 6, a low density parity code encoding device according to an exemplary embodiment may recognize at least two frequency bands using a cognitive radio technology in operation S610. Here, a primary system may have priority over at least one of the two frequency bands.

In operation S620, the low density parity code encoding device according to an exemplary embodiment may perform scheduling with respect to the at least two recognized frequency bands.

In operation S630, the low density parity code encoding device according to an exemplary embodiment may ascertain status information of the at least two frequency bands. Here, the status information of the at least two frequency bands may include information related to an SNR and an SINR.

In operation S640, the low density parity code encoding device according to an exemplary embodiment may determine variable node degrees of sub matrices based on the above status information. Here, a parity check matrix may comprise sub matrixes, and the sub matrixes may correspond to the at least two frequency bands.

The low density parity code encoding device according to an exemplary embodiment may determine the difference of statuses between the frequency bands, and may adjust the variable node degrees for the sub matrixes according to the determined statuses.

Where the at least two frequency bands include a first frequency band and a second frequency band, and where a status of the first frequency band is superior to that of the second frequency band, the low density parity code encoding device according to an exemplary embodiment may determine the variable node degree of the first sub matrix corresponding to the first frequency band to be greater than the variable node degree of the second sub matrix corresponding to the second frequency band.

In operation S650, the low density parity code encoding device according to an exemplary embodiment generates a parity check matrix according to the determined variable node degrees of the sub matrixes.

In operation S660, the low density parity code encoding device according to an exemplary embodiment generates data bits and parity bits using an LDPC with the generated parity check matrix.

Where the frequency bands of the at least two frequency bands include the first frequency band and the second frequency band, and where the status of the first frequency band is superior to the status of the second frequency band, the low density parity code device according to an exemplary embodiment may generate the data bits and the parity bits so that more data bits are allocated to the first frequency band than to the second frequency band, and more parity bits are allocated to the second frequency band than to the first frequency band. This is because it may be more effective where the amount of data bits of signals transmitted via a superior frequency band increase.

Although not illustrated in FIG. 6, a low density parity code decoding method according to an exemplary embodiment may include receiving messages including data bits and parity bits using at least two frequency bands, the message being generated by encoding using an LDPC with a parity check matrix, recognizing the parity check matrix, and correcting an error in the received message using the recognized parity check matrix.

FIG. 7 illustrates a low density parity code encoding device 710 and a low density parity code decoding device 720 according to an exemplary embodiment.

Referring to FIG. 7, the low density parity code encoding device 710 comprises a scheduler 711, a information obtaining unit 712, a matrix generation unit 713, and an encoder 714.

The scheduler 711 recognizes at least two frequency bands using a cognitive radio technology and performs scheduling with respect to the at least two frequency bands.

The information obtaining unit 712 obtains status information of the at least two frequency bands. The status information may be provided by the lower density parity code decoding device 720.

The matrix generator 713 adaptively generates a parity check matrix based on the status information. The parity check matrix may include sub matrices corresponding to the at least two frequency bands. The matrix generator 713 may generate the parity check matrix by adaptively adjusting variable node degrees of the sub matrixes based on the status information.

The encoder 714 generates data bits and parity bits using an LDPC with the generated parity check matrix. Where the at least two frequency bands include a first frequency band and a second frequency band, and where a status of the first frequency band is superior to a status of the second frequency band, the encoder 714 generates the data bits and the parity bits so that more of the data bits are allocated to the first frequency band than to the second frequency band, and more of the parity bits are allocated to the second frequency band than to the first frequency band.

The generated data bits and parity bits are transmitted to the low density parity code decoding device 720 using wireless channels.

The low density parity code decoding device 720 comprises a matrix recognition unit 721, a message receiving unit 722, and an error corrector 723.

The matrix recognition unit 721 may recognize a parity check matrix generated and used by the low parity code encoding device 710. Here, the matrix recognition unit 721 may receive the parity check matrix and related information from the low density parity code encoding device 710, and may be capable of recognizing the parity check matrix using the pre-stored table as illustrated in FIG. 5 and the like.

The message receiving unit 722 may receive a message including data bits and parity bits using at least two frequency bands. The message may be generated by encoding using an LDPC with the parity check matrix.

The error corrector 723 may correct errors in the received message using the recognized parity check matrix. The method and low density parity code encoding and decoding devices of FIGS. 6 and 7 may be further understood with references to FIGS. 1 through 5 and the corresponding descriptions thereof.

A low density parity code encoding device according to an exemplary embodiment may adaptively generate a parity check matrix accordingly to a status of each of frequency bands, thereby taking into consideration of frequency selective properties of wireless channels.

A low density parity code encoding device according to an exemplary embodiment may improve a data transmission rate by determining variable node degrees of a parity check matrix according to a status of each of a plurality of multiple frequency bands.

A low density parity code decoding device according to an exemplary embodiment may reduce a bit error rate (BER) by taking into consideration of a status of each of a plurality of frequency bands and decoding received messages according to the generated parity check matrix.

The methods described above, including the LDPC encoding method and LDPC decoding method according to the above-described exemplary embodiments, may be recorded, stored, or fixed in one or more computer-readable media that includes program instructions to be implemented by a computer to cause a processor to execute or perform the program instructions. The media may also include, alone or in combination with the program instructions, data files, data structures, and the like. Examples of computer-readable media include magnetic media, such as hard disks, floppy disks, and magnetic tape; optical media such as CD ROM disks and DVDs; magneto-optical media, such as optical disks; and hardware devices that are specially configured to store and perform program instructions, such as read-only memory (ROM), random access memory (RAM), flash memory, and the like. Examples of program instructions include both machine code, such as produced by a compiler, and files containing higher level code that may be executed by the computer using an interpreter. The described hardware devices may be configured to act as one or more software modules in order to perform the operations and methods described above.

A number of exemplary embodiments have been described above. Nevertheless, it will be understood that various modifications may be made. For example, suitable results may be achieved if the described techniques are performed in a different order and/or if components in a described system, architecture, device, or circuit are combined in a different manner and/or replaced or supplemented by other components or their equivalents. Accordingly, other implementations are within the scope of the following claims.

What is claimed is:

1. A low density parity code encoding device, the device comprising:
an information obtaining unit which obtains status information of at least two frequency bands;
a matrix generation unit which generates a parity check matrix based on the status information, wherein the parity check matrix comprises sub matrices which correspond to the at least two frequency bands; and
an encoder which generates data bits and parity bits using a low density parity code (LDPC) with the generated parity check matrix.

2. The device of claim 1, wherein the status information of the at least two frequency bands comprises information related to a signal to noise ratio (SNR) and/or a signal to interference plus noise ratio (SINR) of the at least two frequency bands.

3. The device of claim 1, wherein the matrix generation unit generates the parity check matrix by adaptively adjusting variable node degrees of the sub matrices based on the status information.

4. The device of claim 1, wherein the matrix generation unit determines a difference between statuses of the at least two frequency bands based on the status information of the at least two frequency bands, and generates the parity check matrix by adjusting variable node degrees of the sub matrices according to the determined difference between the statuses.

5. The device of claim 1, wherein, where the at least two frequency bands comprise a first frequency band and a second frequency band and where a status of the first frequency band is superior to a status of the second frequency band, the matrix generation unit generates the parity check matrix so that a variable node degree of a first sub matrix corresponding to the first frequency band is greater than a variable node degree of a second sub matrix corresponding to the second frequency band.

6. The device of claim 1, wherein, where the at least two frequency bands comprise a first frequency band and a second frequency band and where a status of the second frequency band is superior to a status of the first frequency band, the matrix generation unit generates the parity check matrix so that a variable node degree of a first sub matrix corresponding to the first frequency band is less than a variable node degree of a second sub matrix corresponding to the second frequency band.

7. The device of claim 1, wherein, where the at least two frequency bands comprise a first frequency band and a second frequency band and where a status of the first frequency band is superior to a status of the second frequency band, the encoder generates the data bits and parity bits so that more data bits are arranged in the first frequency band than the second frequency band and more parity bits are arrange in the second frequency band than the first frequency band.

8. The device of claim 1, further comprising a scheduler which recognizes the at least two frequency bands using a cognitive radio technology and schedules the recognized at least two frequency bands.

9. The device of claim 8, wherein the at least two frequency bands are not adjacent to each other.

10. The device of claim 8, wherein the low density parity code encoding device is for use in a communication system having a primary system, and the primary system has a priority over at least one frequency band of the at least two frequency bands.

11. The device of claim 8, wherein the at least two frequency bands are independent to each other and the scheduler binds the at least two frequency bands and schedules the bound at least two frequency bands.

12. A low density parity code decoding device, the device comprising:
a message receiving unit which receives a message comprising data bits and parity bits using at least two frequency bands, the message being generated by encoding using a low density parity code (LDPC) with a parity check matrix;
a matrix recognition unit which recognizes the parity check matrix; and
an error corrector which corrects an error in the received message using the recognized parity check matrix, wherein the parity check matrix comprises sub matrixes which correspond to the at least two frequency bands, and variable node degrees of the sub matrices are determined depending on statuses of the at least two frequency bands.

13. The device of claim 12, wherein the variable node degrees of the sub matrices are adjusted according to a difference between the statuses of the at least two frequency bands.

14. The device of claim 12, further comprising a resource management unit recognizing the at least two frequency bands using a cognitive radio technology.

15. The device of claim 12, wherein the error corrector corrects the error according to an iteration decoding scheme.

16. The device of claim 12, wherein, where the at least two frequency bands comprise a first frequency band and a second frequency band, where the parity check matrix comprises a first sub matrix corresponding to the first frequency band and a second sub matrix corresponding to the second frequency band, and where a status of the first frequency band is superior to a status of the second frequency band, a variable node degree of the first sub matrix is determined to be greater than a variable node degree of the second sub matrix.

17. A low density parity code encoding method, the method comprising:
  recognizing at least two frequency bands using a cognitive radio technology and scheduling the recognized at least two frequency bands;
  obtaining status information of the at least two frequency bands;
  generating a parity check matrix based on the status information, the parity check matrix comprising sub matrixes corresponding to the at least two frequency bands; and
  generating data bits and parity bits using a low density parity code (LDPC) with the generated parity check matrix.

18. The method of claim 17, wherein the generating of the parity check matrix comprises generating the parity check matrix by adaptively adjusting variable node degrees of the sub matrices based on the status information.

19. The method of claim 17, wherein, where the at least two frequency bands comprise a first frequency band and a second frequency band and where a status of the first frequency band is superior to a status of the second frequency band, the generating of the parity check matrix comprises generating the parity check matrix so that a variable node degree of a first sub matrix corresponding to the first frequency band is greater than a variable node degree of a second sub matrix corresponding to the second frequency band.

20. A low density parity code decoding method, the method comprising:
  receiving a message comprising data bits and parity bits using at least two frequency bands, the message being generated by encoding using a low density parity code (LDPC) with a parity check matrix;
  recognizing the parity check matrix; and
  correcting an error in the received message according to an iteration decoding scheme with the recognized parity check matrix,
  wherein the parity check matrix comprises sub matrixes which correspond to the at least two frequency bands, and variable node degrees of the sub matrices are determined depending on statuses of the at least two frequency bands.

21. The method of claim 20, wherein the variable node degrees of the sub matrixes are adjusted according to a difference between the statuses of the at least two frequency bands.

22. A computer-readable storage medium storing a program to implement a low density parity code encoding method, comprising instructions to cause a computer to:
  recognize at least two frequency bands using a cognitive radio technology and scheduling the recognized at least two frequency bands;
  obtain status information of the at least two frequency bands;
  generate a parity check matrix based on the status information, the parity check matrix comprising sub matrixes corresponding to the at least two frequency bands; and
  generate data bits and parity bits using a low density parity code (LDPC) with the generated parity check matrix.

23. A terminal for use in a wireless communication system, the terminal comprising:
  a transmitting unit to transmit a portion of encoded data using a first frequency band and another portion of the encoded data using a second frequency band; and
  an encoding device to generate the encoded data comprising data bits and parity bits using a block code with a parity check matrix being generated based on status information of the first and second frequency bands.

24. The terminal of claim 23, wherein the block code is a low density parity code (LDPC).

25. The terminal of claim 23, wherein the status information comprises information related to a signal to noise ratio (SNR) and/or a signal to interference plus noise ratio (SINR) of the first and second frequency bands.

26. The terminal of claim 23, wherein the parity check matrix comprises sub matrices corresponding to the first and second frequency bands, and is generated by adjusting variable node degrees of the sub matrices based on the status information.

27. The terminal of claim 23, wherein, where a status of the first frequency band is superior to a status of the second frequency band and where the parity check matrix comprises a first sub matrix corresponding to the first frequency band a second sub matrix corresponding to the second frequency band, the parity check matrix is generated so that a variable node degree of the first sub matrix is greater than a variable node degree of the second sub matrix.

28. The terminal of claim 23, wherein, where a status of the first frequency band is superior to a status of the second frequency band, the encoding device generates the data bits and parity bits so that more data bits are arranged in the first frequency band than the second frequency band and more parity bits are arrange in the second frequency band than the first frequency band.

29. A terminal for use in a wireless communication system, the terminal comprising:
  a receiving unit to receive a portion of encoded data using a first frequency band and another portion of the encoded data using a second frequency band, the encoded data being generated by using a block code with a parity check matrix; and
  an decoding device to correct an error in the encoded data using the parity check matrix, wherein the encoded data comprises data bits and parity bits and is generated based on status information of the first and second frequency bands.

30. The terminal of claim 29, wherein the parity check matrix comprises sub matrixes which correspond to the first and second frequency bands and variable node degrees of the sub matrices are determined based on statuses of the first and second frequency bands.

* * * * *